United States Patent
Hong et al.

(10) Patent No.: US 8,559,240 B2
(45) Date of Patent: Oct. 15, 2013

(54) SENSE AMPLIFYING CIRCUIT, AND SEMICONDUCTOR MEMORY DEVICE HAVING THE SAME

(75) Inventors: Sang-Pyo Hong, Seongnam-si (KR); Doo-Young Kim, Seongnam-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 392 days.

(21) Appl. No.: 12/917,602

(22) Filed: Nov. 2, 2010

(65) Prior Publication Data

US 2011/0128797 A1    Jun. 2, 2011

(30) Foreign Application Priority Data

Dec. 1, 2009   (KR) .......................... 10-2009-0118036

(51) Int. Cl.
*G11C 16/04*   (2006.01)

(52) U.S. Cl.
USPC . 365/189.05; 365/207; 365/208; 365/185.21; 327/51; 327/52; 327/57

(58) Field of Classification Search
USPC .......... 365/189.05, 207, 208, 185.21; 327/51, 327/52, 57
See application file for complete search history.

(56) References Cited

U.S. PATENT DOCUMENTS

| | | | |
|---|---|---|---|
| 6,256,234 B1 | 7/2001 | Keeth et al. | |
| 7,800,970 B2* | 9/2010 | Hong et al. | 365/208 |
| 8,213,250 B2* | 7/2012 | Song | 365/205 |
| 2005/0007842 A1 | 1/2005 | Nakashima | |
| 2008/0198680 A1* | 8/2008 | Park | 365/230.03 |

FOREIGN PATENT DOCUMENTS

| | | |
|---|---|---|
| JP | 2000-331483 | 11/2000 |
| JP | 2005-032398 | 2/2005 |
| JP | 2008-084529 | 4/2008 |
| KR | 10-2005-0009156 | 1/2005 |

* cited by examiner

*Primary Examiner* — Connie Yoha
(74) *Attorney, Agent, or Firm* — Muir Patent Consulting, PLLC

(57) ABSTRACT

A CMOS latch-type sense amplifying circuit is disclosed. The circuit comprises a CMOS differential amplifier configured to amplify a voltage signal of an input line pair to generate a first amplified voltage signal pair, and provide the first amplified voltage signal pair to an output line pair, a first pre-charge voltage having a first voltage level being applied to the input line pair. The circuit further comprises a CMOS latch-type sense amplifier configured to amplify a voltage signal of the output line pair to generate a second amplified voltage signal pair, and provide the second amplified voltage signal pair to the output line pair. The circuit additionally comprises a first common node controlled by a first common enable signal and connected to both the CMOS differential amplifier and the CMOS latch-type sense amplifier, such that the first common enable signal controls both the CMOS differential amplifier and the CMOS latch-type sense amplifier.

20 Claims, 9 Drawing Sheets

US 8,559,240 B2

SENSE AMPLIFYING CIRCUIT, AND SEMICONDUCTOR MEMORY DEVICE HAVING THE SAME

PRIORITY STATEMENT

This application claims the benefit of priority under 35 U.S.C. §119 from Korean Patent Application No. 10-2009-0118036, filed on Dec. 1, 2009, the contents of which are hereby incorporated by reference in their entirety.

BACKGROUND

1. Technical Field

Example embodiments relate to a semiconductor device, and particularly to a semiconductor memory device having a latch-type sense amplifying circuit and method of sensing a voltage signal.

2. Description of Related Art

Semiconductor memory devices are used for storing data in a variety of electronic products and applications. A sense amplifying circuit is used in the process of inputting or outputting of data of a semiconductor memory device. There are different types of sense amplifying circuits, including, for example, a bit-line sense amplifying circuit that amplifies a voltage of a bit-line pair, a local sense amplifying circuit that amplifies a voltage of a local input/output line pair, and an input/output sense amplifying circuit that amplifies a voltage of a global input/output line pair.

SUMMARY

Example embodiments provide a CMOS latch-type sense amplifying circuit capable of decreasing signal interference between an input line pair and an output line pair by electrically separating the input line pair and an output line pair.

Example embodiments also provide a semiconductor memory device including the CMOS latch-type sense amplifying circuit.

Example embodiments also provide a method of sensing a voltage signal capable of decreasing signal interference between an input line pair and an output line pair by electrically separating the input line pair and an output line pair.

Example embodiments are directed to a CMOS latch-type sense amplifying circuit including a CMOS differential amplifier and a CMOS latch-type sense amplifier.

In one embodiment, A CMOS latch-type sense amplifying circuit is disclosed. The circuit comprises a CMOS differential amplifier, a CMOS latch-type sense amplifier, and a first common node. The CMOS differential amplifier is configured to amplify a voltage signal of an input line pair to generate a first amplified voltage signal pair, and provide the first amplified voltage signal pair to an output line pair. A first pre-charge voltage having a first voltage level is applied to the input line pair. The CMOS latch-type sense amplifier is configured to amplify a voltage signal of the output line pair to generate a second amplified voltage signal pair, and provide the second amplified voltage signal pair to the output line pair. The first common node is controlled by a first common enable signal and connected to both the CMOS differential amplifier and the CMOS latch-type sense amplifier, such that the first common enable signal controls both the CMOS differential amplifier and the CMOS latch-type sense amplifier.

In another embodiment, a CMOS latch-type sense amplifying circuit is disclosed. The circuit includes a first stage amplifier, a second stage sense amplifier, a switch circuit, and a first common node. The first stage amplifier is configured to amplify a voltage signal of an input line pair to generate a first amplified voltage signal pair, and provide the first amplified voltage signal pair to a first line pair. A first pre-charge voltage having a first voltage level is applied to the input line pair. The second stage sense amplifier is configured to amplify a voltage signal of the first line pair to generate a second amplified voltage signal pair, and provide the second amplified voltage signal pair to the first line pair. The switch circuit is coupled between the first line pair and an output line pair, and is configured to electrically couple the first line pair to the output line pair in response to a first switch control signal. A second pre-charge voltage having a second voltage level is applied to the output line pair. The first common node is controlled by a second switch control signal and connected to both the first stage amplifier and the second stage sense amplifier, such that the second switch control signal controls both the first stage amplifier and the second stage sense amplifier.

In a further embodiment, a semiconductor memory device is disclosed. The semiconductor memory device includes a memory core coupled to a bit-line pair, a column selecting circuit configured to output voltage signals of the bit-line pair to a local input/output line pair in response to a column selecting signal, a local sense amplifying circuit configured to receive a first set of voltage signals of the local input/output line pair, and output a second set of voltage signals to a first line pair, a global selecting circuit configured to output voltage signals of the first line pair to a global input/output line pair in response to a global selecting signal, an input/output sense amplifying circuit configured to amplify the voltage signals output from the global selecting circuit, and an output buffer configured to receive voltage signals output from the input/output sense amplifying circuit and output an output voltage signal to an output line. In one embodiment, the voltage signals of the local input/output line pair are electrically separated from the voltage signals output from the global input/output line pair, such that interference on the first set of input signals is reduced.

Therefore, the CMOS latch-type sense amplifying circuit performs sensing operation fast. Accordingly, the CMOS latch-type sense amplifying circuit according to example embodiments has a high sensing efficiency, a low noise, and may stably perform a read operation and a write operation.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION

Figure 1:
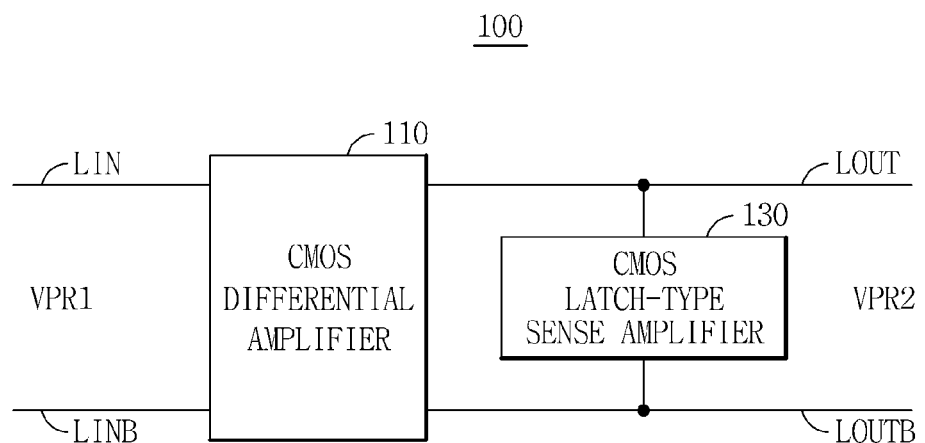
FIG. 1 is a block diagram illustrating a CMOS latch-type sense amplifying circuit according to a first example embodiment.

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession, or two steps shown in succession, may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

FIG. 1 is a block diagram illustrating a CMOS latch-type sense amplifying circuit 100 according to a first example embodiment.

Referring to FIG. 1, the CMOS latch-type sense amplifying circuit 100 includes a CMOS differential amplifier 110 and a CMOS latch-type sense amplifier 130.

The CMOS differential amplifier 110 amplifies a voltage signal of an input line pair LIN and LINB to which a first pre-charge voltage VPR1 having a first voltage level is applied in a pull-up mode and a pull-down mode to generate a first amplified voltage signal pair (e.g., it amplifies a difference between the voltage levels of the voltages of the input line LIN and the input line LINB). The CMOS differential amplifier 110 provides the first amplified voltage signal pair to an output line pair LOUT and LOUTB. The CMOS latch-type sense amplifier 130 amplifies a voltage signal of the output line pair LOUT and LOUTB to which a second pre-charge voltage VPR2 having a second voltage level is applied in the pull-up mode and the pull-down mode to generate a second amplified voltage signal pair. The CMOS latch-type sense amplifier 130 provides the second amplified voltage signal pair to the output line pair LOUT and LOUTB (e.g., the difference between the voltage level at output line LOUT and output line LOUTB is increased).

Figure 2:
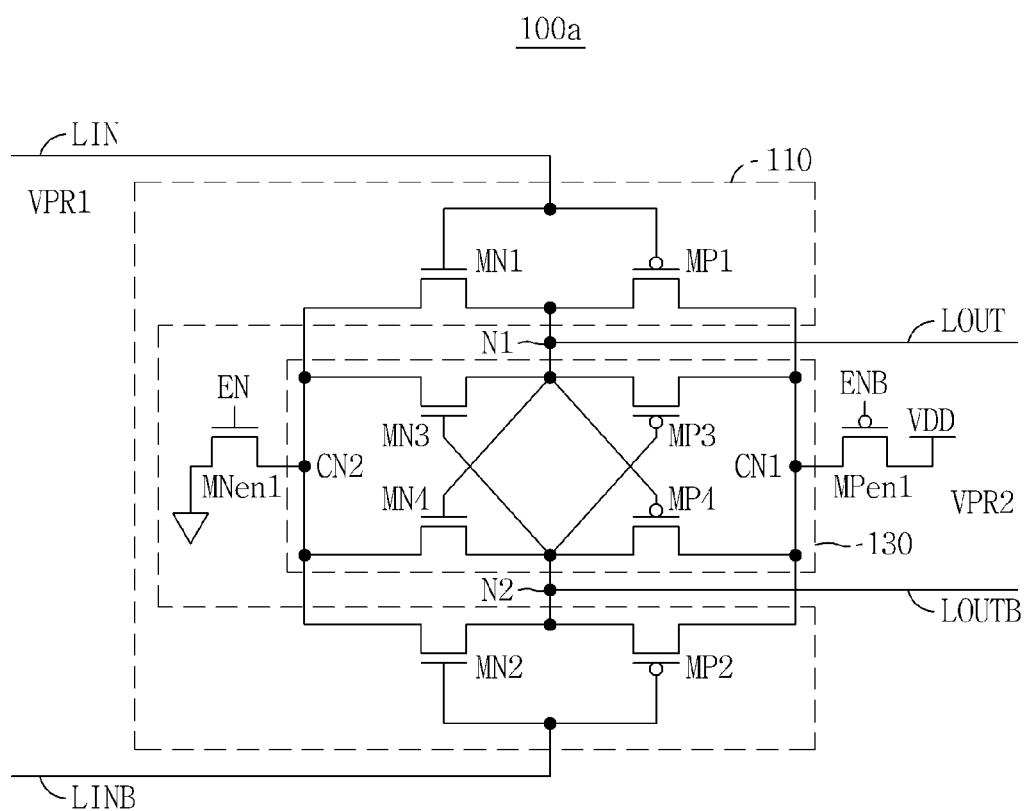
FIG. 2 is an exemplary detailed circuit diagram of the CMOS latch-type sense amplifying circuit of FIG. 1, according to one embodiment.

FIG. 2 is an exemplary detailed circuit diagram of the CMOS latch-type sense amplifying circuit 100 of FIG. 1, according to one embodiment.

Referring to FIG. 2, the CMOS latch-type sense amplifying circuit 100a includes a CMOS differential amplifier 110 and a CMOS latch-type sense amplifier 130, each comprised of complementary metal oxide semiconductor (CMOS) transistors. In a CMOS circuit comprised of CMOS transistors, a PMOS transistor and an NMOS transistor operate in a complementary fashion.

The CMOS differential amplifier 110 may include a first PMOS transistor MP1, a first NMOS transistor MN1, a second PMOS transistor MP2, a second NMOS transistor MN2, a control PMOS transistor MPen1, and a control NMOS transistor MNen1.

The first PMOS transistor MP1 has a source connected to a common node CN1, a drain connected to a first node N1, and a gate connected to a first input line LIN. The first NMOS transistor MN1 has a drain connected to the first node N1, a source connected to a common node CN2, and a gate connected to the first input line LIN. As such, first PMOS transistor MP1 and first NMOS transistor MN1 include CMOS transistors whose gates connect to first input line LIN and whose drains connect to a first node N1 on output line LOUT, thereby electrically separating first input line LIN from first output line LOUT (for the purposes of this disclosure, the term "electrically separated" would include a situation where a direct current cannot flow between two points within a circuit. Thus, a node connected to a MOSFET transistor gate will be electrically separated from a node connected to either the source or the drain of the transistor, assuming no other wiring is connecting the nodes).

The second PMOS transistor MP2 has a source connected to the common node CN1, a drain connected to a second node N2, and a gate connected to a second input line LINB that composes the input line pair with the first input line LIN. The second NMOS transistor MN2 has a drain connected to the second node N2, a source connected to the common node CN2, and a gate connected to the second input line LINB. As such, second PMOS transistor MP2 and second NMOS transistor MN2 include CMOS transistors whose gates connect to second input line LINB, and whose drains connect to a second node N2 on second output line LOUTB, thereby electrically separating second input line LINB from second output line LOUTB.

In one embodiment, control PMOS transistor MPen1 has a source connected to a high supply voltage (e.g., VDD), a gate to which a control signal ENB (e.g., an enable signal) is applied, and a drain connected to node CN1. Control NMOS transistor MNen1 has a source connected to a low supply voltage (e.g., ground), a gate to which a control signal EN (e.g., an enable signal) is applied, and a drain connected to node CN2. In one embodiment, control signals EN and ENB are complimentary signals to each other. As such, a common control signal EN is applied to NMOS transistor MNen1, which has a drain connected to NMOS transistors MN1 and MN2 through common node CN2, and a common control signal ENB is applied to PMOS transistor MPen1, which has a drain connected to PMOS transistors MP1 and MP2 through common node CN1.

Although two control transistors are shown (MPen1 and MNen1), in one embodiment, only one control transistor is included. For example, in one embodiment, common node CN2 may be connected directly to ground, but common node CN1 remains connected to the drain of control PMOS transistor MPen1, while in another embodiment, common node CN1 may be connected directly to supply voltage VDD, but common node CN2 remains connected to the drain of control NMOS transistor MNen1.

As shown in FIG. 2, the first node N1 is connected to a first output line LOUT, and the second node N2 is connected to a second output line LOUTB which comprises the output line pair with the first output line LOUT.

The CMOS latch-type sense amplifier 130 may include a third PMOS transistor MP3, a third NMOS transistor MN3, a fourth PMOS transistor MP4, and a fourth NMOS transistor MN4.

The third PMOS transistor MP3 has a source connected to common node CN1, a drain connected to the first node N1, and a gate connected to the second node N2. The third NMOS transistor MN3 has a drain connected to the first node N1, a source connected to common node CN2, and a gate connected to the second node N2. The fourth PMOS transistor MP4 has a source connected to common node CN1, a drain connected to the second node N2, and a gate connected to the first node N1. The fourth NMOS transistor MN4 has a drain connected to the second node N2, a source connected to common node CN2, and a gate connected to the first node N1.

The CMOS latch-type sense amplifier 130 amplifies the voltage signal of the output line pair LOUT and LOUTB in the pull-up mode and the pull-down mode (e.g., LOUT causes a voltage at node N2 to pull up toward VDD or down toward ground, and LOUTB causes a voltage at node N1 to pull in the opposite direction as N2) to provide to a second output line pair LOUT and LOUTB. That is, a first output voltage pair at lines LOUT and LOUTB resulting from amplification due only to differential amplifier 110 has a first amplification, and a second output voltage pair at lines LOUT and LOUTB resulting from amplification due to both differential amplifier 110 and latch-type sense amplifier 130 has a second amplification, greater than the first amplification. In one embodiment, the CMOS latch-type sense amplifier 130 has PMOS transistors MP3 and MP4 and NMOS transistors MN3 and MN4 cross-coupled to each other to form a latch.

As the magnitude of a voltage of the first output line LOUT increases, a magnitude of a current flowing through the fourth NMOS transistor MN4 increases, but a magnitude of a voltage of the second node N2, which is a voltage of the second output line LOUTB, decreases. In this condition, a magnitude of a current flowing through the third NMOS transistor MN3 decreases and a magnitude of current flowing through third PMOS transistor MP3 increases, causing the voltage of node N1 to increase. As the magnitude of a voltage of the first output line LOUT increases, a magnitude of a current flowing through the fourth PMOS transistor MP4 decreases, and a magnitude of a voltage of the second output line LOUTB, decreases. In this condition, a magnitude of a current flowing through the third PMOS transistor MP3 increases.

Therefore, in one embodiment, the magnitude of the first output line LOUT increases to a level of the supply voltage VDD, the magnitude of the second output line LOUTB decreases to a level of the ground voltage. Therefore, the CMOS latch-type sense amplifier 130 performs amplification in the pull-up mode and the pull-down mode.

Figure 3:
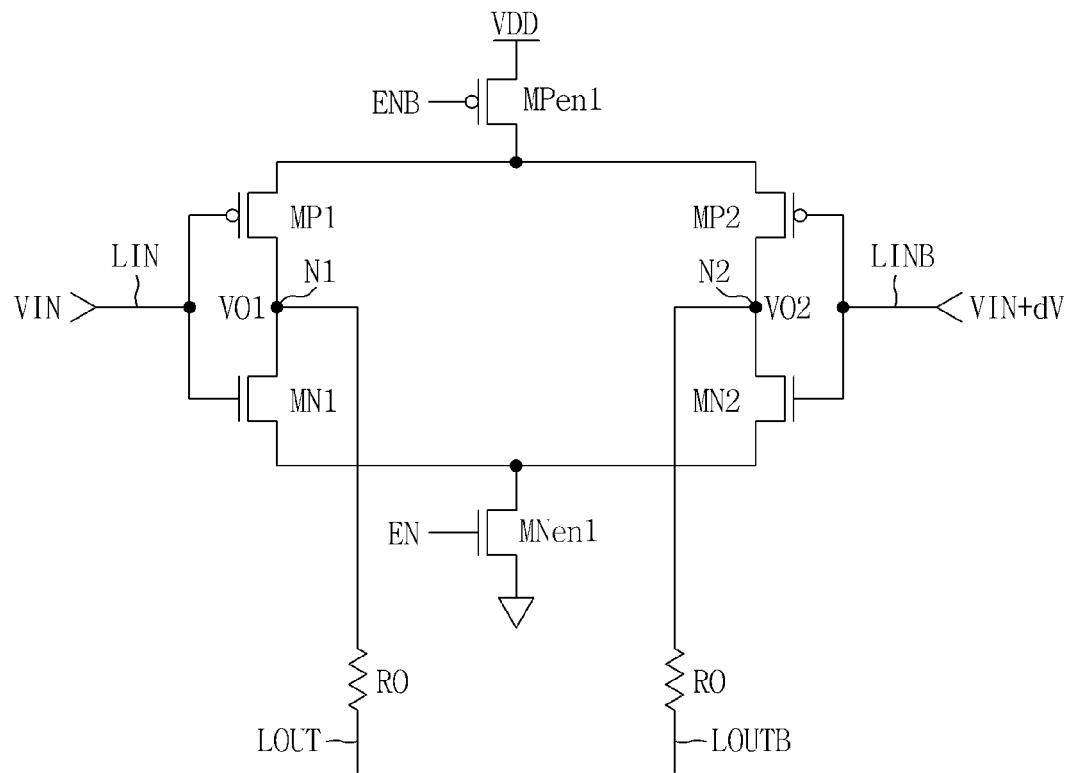
FIG. 3 is an exemplary circuit diagram illustrating a CMOS differential amplifier comprising the CMOS latch-type sense amplifier shown in FIG. 2, according to one embodiment.

FIG. 3 is an exemplary circuit diagram illustrating a CMOS differential amplifier 110 comprising the CMOS latch-type sense amplifier 100a shown in FIG. 2.

In FIG. 3, an input voltage signal VIN is applied to a gate of the first PMOS transistor MP1 and a gate of the first NMOS transistor MN1 through the first input line LIN, and an input voltage VIN+dV is applied to a gate of the second PMOS transistor MP2 and a gate of the second NMOS transistor MN2 through the second input line LINB.

The CMOS differential amplifier 110 amplifies the voltage signal of the input line pair LIN and LINB in the pull-up mode and the pull-down mode to provide to an output line pair LOUT and LOUTB.

When the magnitude of the input voltage signal VIN+dV applied through the second input line LINB is larger than the magnitude of the input voltage signal VIN applied through the first input line LIN, more current flows through the second NMOS transistor MN2 than through the first NMOS transistor MN1, and more current flows through the first PMOS transistor MP1 than through the second PMOS transistor MP2. Therefore, a voltage VO1 of the first node N1 is higher than a voltage VO2 of the second node VO2, and VO1-VO2 has a positive value.

When the transconductance of each of the first PMOS transistor MP1 and the second PMOS transistor MP2 is gmp and the transconductance of each of the first NMOS transistor MN1 and the second NMOS transistor MN2 is gmn, and the output resistance of the first node N1 and the second node N2 is RO, an output voltage VO1-VO2 may be expressed as expression 1.

$$VO1-VO2=(gmp+gmn)*RO*dV \qquad \text{Expression 1}$$

Referring to expression 1, the input resistance of the CMOS differential amplifier 110 of FIG. 3 may be expressed as 1/(gmp+gmn). Therefore, when the output resistance RO is larger than the input resistance 1/(gmp+gmn), the CMOS differential amplifier 110 of FIG. 3 may perform amplification.

Hereinafter, the operation of the CMOS latch-type sense amplifying circuit 100 of FIG. 1 referring to FIG. 1, FIG. 2 and FIG. 3 is described, according to one exemplary embodiment.

The first input line LIN and the second input line LINB comprising the input line pair LIN and LINB is pre-charged to a first pre-charge voltage VPR1, and the first output line LOUT and the second output line LOUTB comprising the output line pair LOUT and LOUTB is pre-charged to a second pre-charge voltage VPR2. The first pre-charge voltage VPR1 and the second pre-charge voltage VPR2 may have a different voltage level.

In the conventional art, the input line pair LIN and LINB was affected by the state of the output line pair LOUT and LOUTB because the input line pair LIN and LINB and the output line pair LOUT and LOUTB are electrically connected to each other. That is, a signal of the input line pair LIN and LINB was interfered by a signal of the output line pair LOUT and LOUTB.

The CMOS latch-type sense amplifying circuit 100 of FIG. 1 may decrease the interference of signals between the input line pair LIN and LINB and the output line pair LOUT and LOUTB by electrically separating the input line pair LIN and LINB and the output line pair LOUT and LOUTB using the CMOS differential amplifier 110.

The CMOS latch-type sense amplifying circuit 100 of FIG. 1 primarily amplifies a voltage signal applied through the input line pair LIN and LINB using the CMOS differential amplifier 110 to provide to the output line pair LOUT and LOUTB, and secondarily amplifies a voltage signal of the output line pair LOUT and LOUTB using the CMOS latch-type sense amplifier 130 to provide to the output line pair LOUT and LOUTB again. As such, the differential amplifier 110 functions as a first stage amplifier, and the sense amplifier 130 functions as a second stage amplifier, such that the output of the first stage amplifier is input into the second stage amplifier to perform amplification of the input line pair LIN and LINB voltage signal. In one embodiment, these amplifications occur simultaneously. Furthermore, because the first stage amplifier electrically separates the input line pair voltage signal from an output signal, it reduces the interference and distortion of the input line signal due to the output signal.

Referring to FIG. 2 and FIG. 3, both the CMOS differential amplifier 110 and the CMOS latch-type sense amplifier 130 operate as CMOS circuits. The CMOS differential amplifier 110 amplifies a voltage signal of the input line pair LIN and LINB in the pull-up mode and the pull-down mode to provide to the output line pair LOUT and LOUTB, and the CMOS latch-type sense amplifier 130 amplifies a voltage signal of the output line pair LOUT and LOUTB in the pull-up mode and the pull-down mode to provide to the output line pair LOUT and LOUTB again.

Accordingly, the CMOS latch-type sense amplifying circuit 100 of FIG. 1 may have a high sensing efficiency and low interference between an input line pair and an output line pair. In particular, in the CMOS latch-type sense amplifying circuit 100, the phenomenon of a distortion of a voltage signal of an input line pair due to a voltage signal of an output line pair may be decreased.

Figure 4:
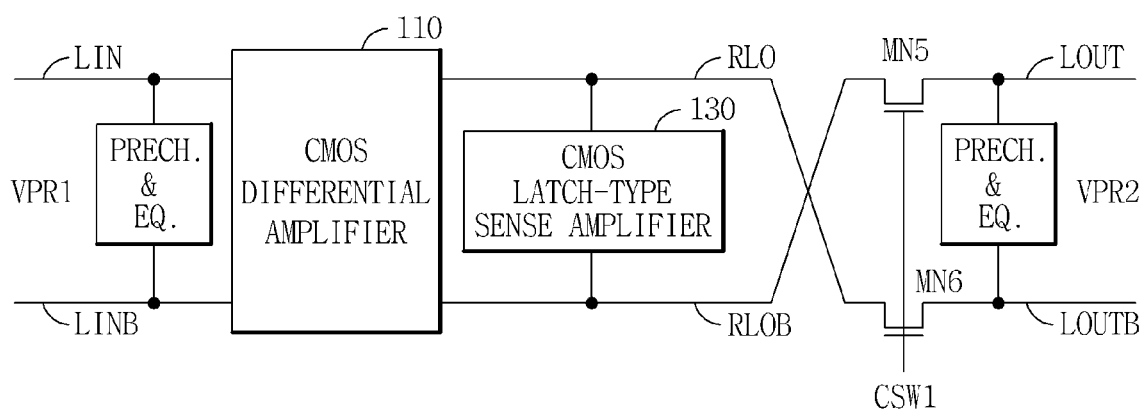
FIG. 4 is a block diagram illustrating a CMOS latch-type sense amplifying circuit according to a second example embodiment.

FIG. 4 is a block diagram illustrating a CMOS latch-type sense amplifying circuit 200 according to a second example embodiment.

Referring to FIG. 4, the CMOS latch-type sense amplifying circuit 200 includes a CMOS differential amplifier 110, a CMOS latch-type sense amplifier 130 and a switch circuit.

The CMOS differential amplifier 110 amplifies a voltage signal of an input line pair LIN and LINB to which a first pre-charge voltage VPR1 having a first voltage level is applied in a pull-up mode and a pull-down mode to generate a first amplified voltage signal pair. The CMOS differential amplifier 110 provides the first amplified voltage signal pair to a first line pair RLO and RLOB. The CMOS latch-type sense amplifier 130 amplifies a voltage signal of the first line pair RLO and RLOB in the pull-up mode and the pull-down mode to generate a second amplified voltage signal pair. The CMOS latch-type sense amplifier 130 provides the second amplified voltage signal pair to the first line pair RLO and RLOB. On one embodiment, the CMOS differential amplifier 110 and CMOS latch-type sense amplifier 130 are configured such that both are enabled simultaneously and the amplifications occur simultaneously (e.g., the first pre-charge voltage VPR1 is amplified at the same time as the first amplified voltage signal pair is being amplified). The switch circuit is coupled between the first line pair RLO and RLOB and the output line pair LOUT and LOUTB to which a second pre-charge voltage VPR2 having a second voltage level is applied, and electrically couples the first line pair RLO and RLOB to the output line pair LOUT and LOUTB. The switch circuit may be comprised of MOS transistors MN5 and MN6.

In the example of FIG. 4, a first line RLO is electrically connected to the second output line LOUTB through the NMOS transistor MN6, and a second line RLOB is electrically connected to the first output line LOUT through the NMOS transistor MN5.

In the CMOS latch-type sense amplifying circuit 200 of FIG. 4, the output line pair LOUT and LOUTB, and the first line pair RLO and RLOB which includes output terminals of the CMOS latch-type sense amplifier 130, are connected or disconnected using the switch circuit, while the CMOS latch-type sense amplifying circuit 200 amplifies a voltage signal of the input line pair LIN and LINB in the pull-up mode and the pull-down mode using the CMOS differential amplifier 110 and the CMOS latch-type sense amplifier 130. Therefore, the CMOS latch-type sense amplifying circuit 200 may decrease a loading due to the output line pair LOUT and LOUTB in the process of amplification.

In the CMOS latch-type sense amplifying circuit 200, voltage signals of the first line pair RLO and RLOB which are output signals of the CMOS differential amplifier 110 have opposite phases to voltage signals of the input line pair LIN and LINB which are input signals of the CMOS differential amplifier 110. Therefore, the first line pair RLO and RLOB and the output line pair LOUT and LOUTB are cross-coupled to each other through the switch circuit.

When sensing and amplification are completed, the CMOS latch-type sense amplifying circuit 200 turns on the MOS transistors MN5 and MN6 in response to a first switch control signal CSW1 to transfer signals of the first line pair RLO and RLOB to the output line pair LOUT and LOUTB.

Figure 5:
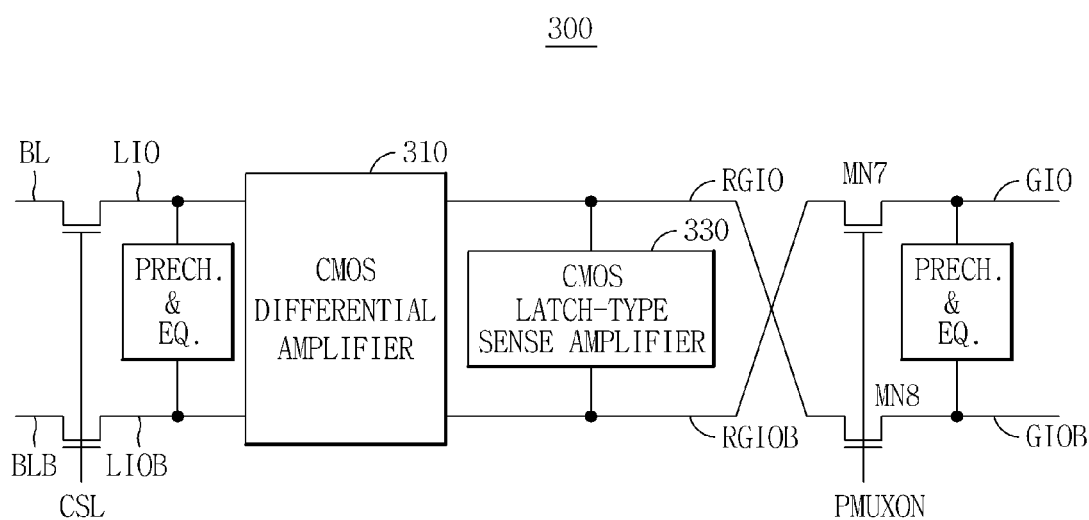
FIG. 5 is a block diagram illustrating a CMOS latch-type sense amplifying circuit according to a third example embodiment.

FIG. 5 is a block diagram illustrating a CMOS latch-type sense amplifying circuit 300 according to a third example embodiment. The CMOS latch-type sense amplifying circuit 300 is a local sense amplifier of a semiconductor memory device, and has a similar structure as the CMOS latch-type sense amplifying circuit 200 shown in FIG. 4.

Referring to FIG. 5, the CMOS latch-type sense amplifying circuit 300 includes a first switch circuit, a CMOS differential amplifier 310, a CMOS latch-type sense amplifier 330 and a second switch circuit.

In FIG. 5, a local input/output line pair LIO and LIOB corresponds to the input line pair LIN and LINB of FIG. 4, a first line pair RGIO and RGIOB corresponds to the first line pair RLO and RLOB of FIG. 4, and a global input/output line pair GIO and GIOB corresponds to the output line pair LOUT and LOUTB. The first switch circuit is comprised of MOS transistors, and electrically connects or disconnects a bit line pair BL and BLB and the local input/output line pair LIO and LIOB by a column select line CSL. In one embodiment, the bit line pair BL/BLB can be connected to a bit line sense amplifier (not shown). The second switch circuit is comprised of MOS transistors MN7 and MN8, and electrically connects or disconnects the first line pair RGIO and RGIOB and the global input/output line pair GIO and GIOB.

In the CMOS latch-type sense amplifying circuit 300 of FIG. 5, a pre-charge voltage level of the global input/output line pair GIO and GIOB may be higher than or the same as a pre-charge voltage level of the local input/output line pair LIO and LIOB. In another case, the pre-charge voltage level of the global input/output line pair GIO and GIOB may be lower than the pre-charge voltage level of the local input/output line pair LIO and LIOB.

The operation of the CMOS latch-type sense amplifying circuit 300 of FIG. 5 is similar to the operation of the CMOS latch-type sense amplifying circuit 200 of FIG. 4. Therefore, the operation of the CMOS latch-type sense amplifying circuit 300 of FIG. 5 will not be explained.

Figure 6:
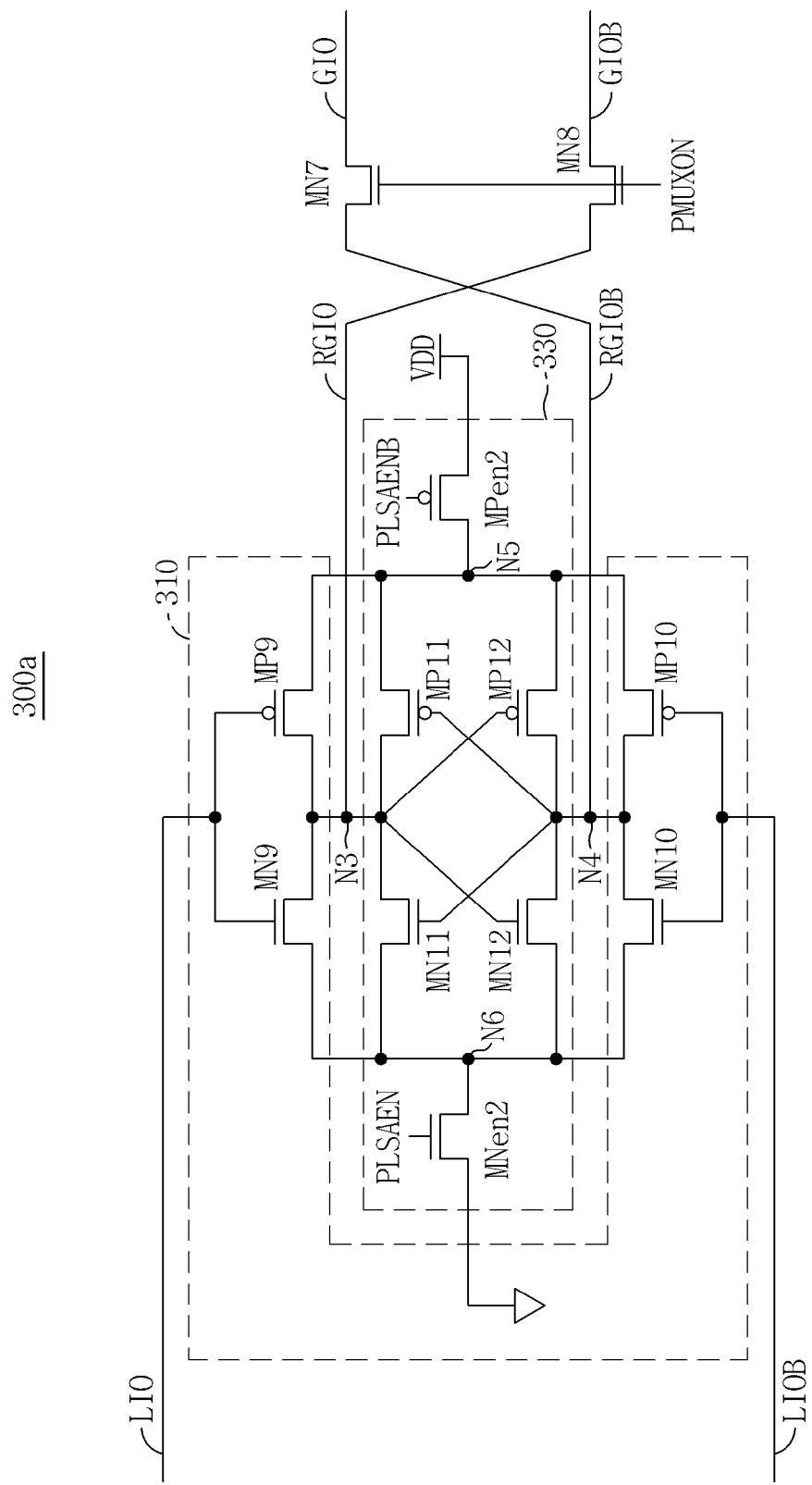
FIG. 6 is an exemplary detailed circuit diagram of the CMOS latch-type sense amplifying circuit of FIG. 5, according to one embodiment.

FIG. 6 is an exemplary detailed circuit diagram of the CMOS latch-type sense amplifying circuit 300 of FIG. 5.

Referring to FIG. 6, the CMOS latch-type sense amplifier 330 may include an eleventh PMOS transistor MP11, an eleventh NMOS transistor MN11, a twelfth PMOS transistor MP12, a twelfth NMOS transistor MN12, a control PMOS transistor MPen2 and a control NMOS transistor MNen2.

The CMOS latch-type sense amplifying circuit 300a of FIG. 6 turns on the control PMOS transistor MPen2 and the control NMOS transistor MNen2 in response to a second switch control signal PLSAENB and a third switch control signal PLSAEN while the CMOS latch-type sense amplifying circuit 300a senses and amplifies a voltage signal of the local input/output line pair LIO and LIOB.

The control PMOS transistor MPen2 has a source connected to a supply voltage VDD, a gate to which second switch control signal PLSAENB is applied, and a drain connected to a fifth node N5. The eleventh PMOS transistor MP11 has a source connected to the fifth node N5, a drain connected to the first line RGIO (third node N3), and a gate connected to the fourth node N4. The eleventh NMOS transistor MN11 has a drain connected to the third node N3, a source connected to the sixth node N6, and a gate connected to the fourth node N4. The twelfth PMOS transistor MP12 has a source connected to the fifth node N5, a drain connected to the fourth node N4, and a gate connected to the third node N3. The twelfth NMOS transistor MN12 has a drain connected to the fourth node N4, a source connected to the sixth node N6, and a gate connected to the third node N3. The control NMOS transistor MNen2 has a source connected to the ground voltage, a gate to which the third switch control signal PLSAEN, which is a complementary signal of the second switch control signal PLSAENB, is applied, and a drain connected to the sixth node N6.

In the circuit of FIG. 6, the third node N3 is connected to the first line RGIO and the fourth node N4 connected to the second line RGIOB which comprises a first line pair RGIO and RGIOB with the first line RGIO.

The CMOS latch-type sense amplifier 330 performs amplification in a pull-up mode using the eleventh PMOS transistor MP11 and the twelfth PMOS transistor MP12, and in a pull-down mode using the eleventh NMOS transistor MN11 and the twelfth NMOS transistor MN12.

Referring to FIG. 6, the CMOS differential amplifier 310 includes the ninth PMOS transistor MP9, the ninth NMOS transistor MN9, the tenth PMOS transistor MP10 and the tenth NMOS transistor MN10.

The ninth PMOS transistor MP9 has a source connected to the fifth node N5, a drain connected to a third node N3, and a gate connected to the first local input/output line LIO. The ninth NMOS transistor MN9 has a drain connected to the third node N3, a source connected to the sixth node N6, and a gate connected to the first local input/output line LIO. The tenth PMOS transistor MP10 has a source connected to the fifth node N5, a drain connected to a fourth node N4, and a gate connected to the second local input/output line LIOB which comprises a local input/output line pair with the first local input/output line LIO. The tenth NMOS transistor MN10 has a drain connected to the fourth node N4, a source connected to the sixth node N6, and a gate connected to the second local input/output line LIOB.

The CMOS differential amplifier 310 performs amplification in a pull-up mode using the ninth PMOS transistor MP9 and the tenth PMOS transistor MP10, and in a pull-down mode using the ninth NMOS transistor MN9 and the tenth NMOS transistor MN10.

Figure 7:
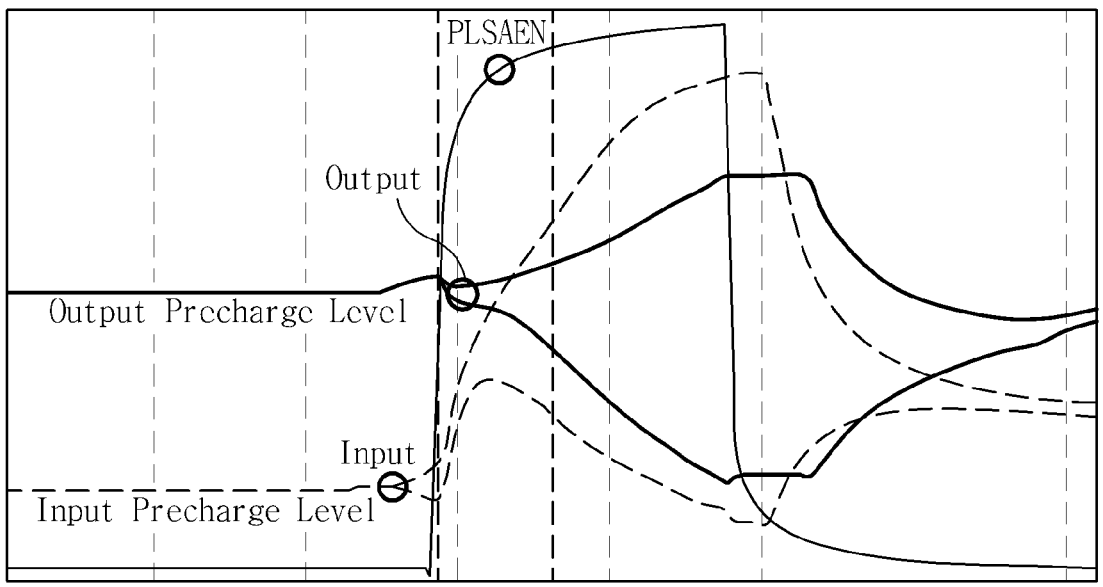
FIG. 7 is an exemplary simulation diagram illustrating an operation of a conventional latch-type sense amplifying circuit, according to one embodiment.
Figure 8:
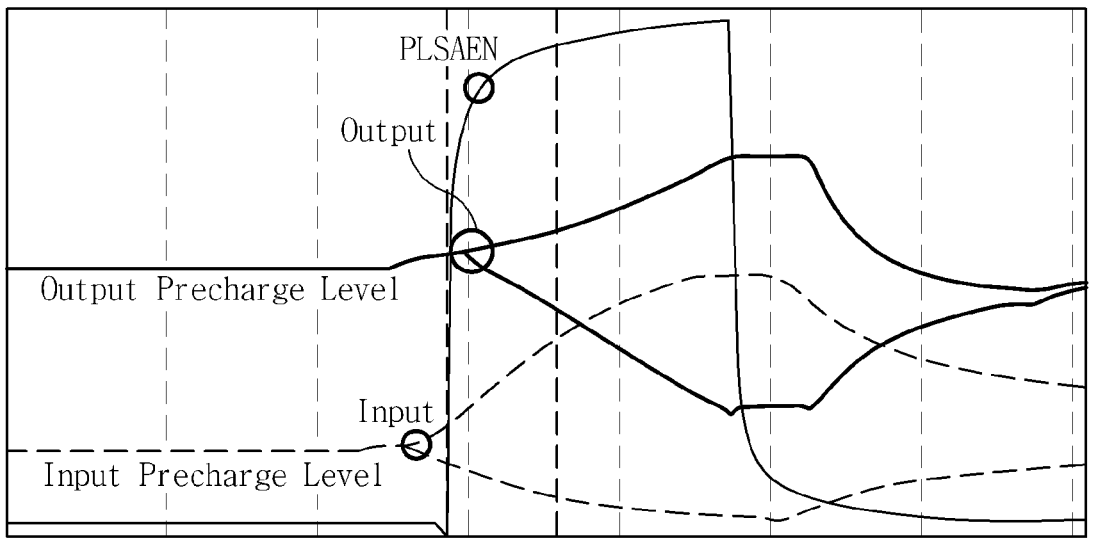
FIG. 8 is an exemplary simulation diagram illustrating an operation of a CMOS latch-type sense amplifying circuit according to example embodiments.

FIG. 7 is a simulation diagram illustrating an operation of a conventional latch-type sense amplifying circuit, and FIG. 8 is a simulation diagram illustrating an operation of a CMOS latch-type sense amplifying circuit according to example embodiments.

Referring to FIG. 7 and FIG. 8, in the conventional latch-type sense amplifying circuit, the waveform of an input voltage signal INPUT is distorted due to an output voltage signal OUTPUT, in the process of performing sensing and amplification when the third switch control signal PLSAEN and a column select line CSL are enabled. On the contrary, in the CMOS latch-type sense amplifying circuit according to example embodiments, the waveform of the input voltage signal INPUT is not much affected by the output voltage signal OUTPUT. The waveforms of FIG. 7 and FIG. 8 are results simulated using pre-charge voltages of a local input/output line having the same level.

Figure 9:
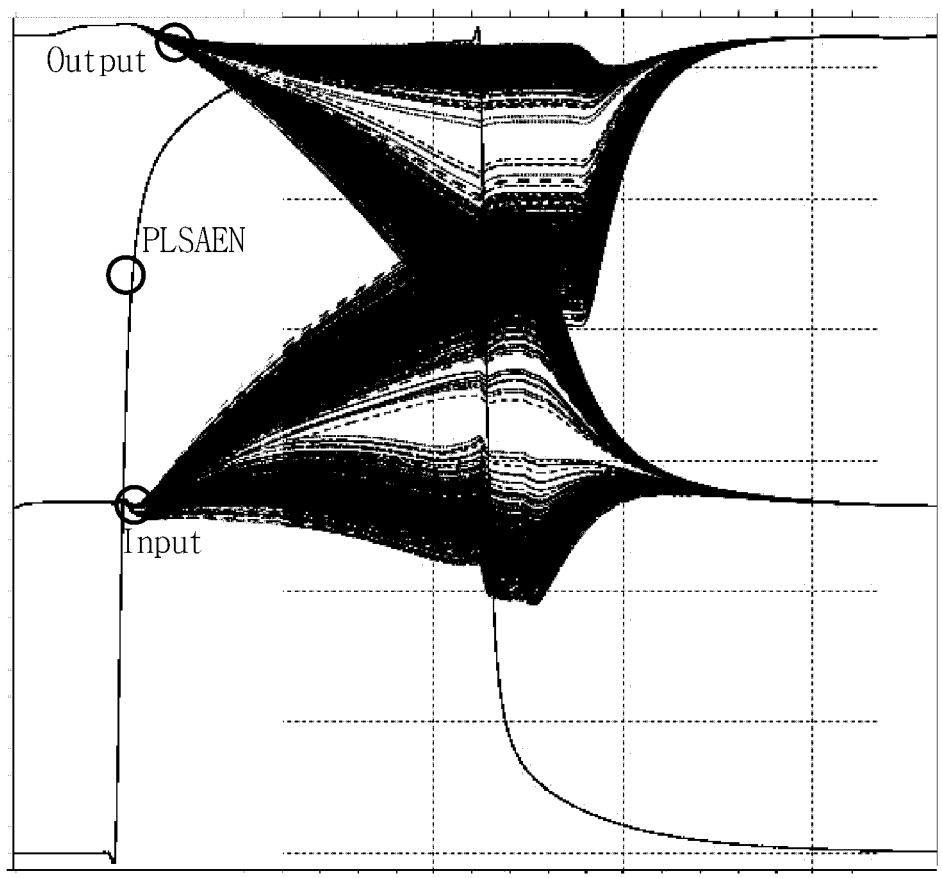
FIG. 9 is an exemplary Monte Carlo simulation diagram illustrating an operation of a conventional latch-type sense amplifying circuit.
Figure 10:
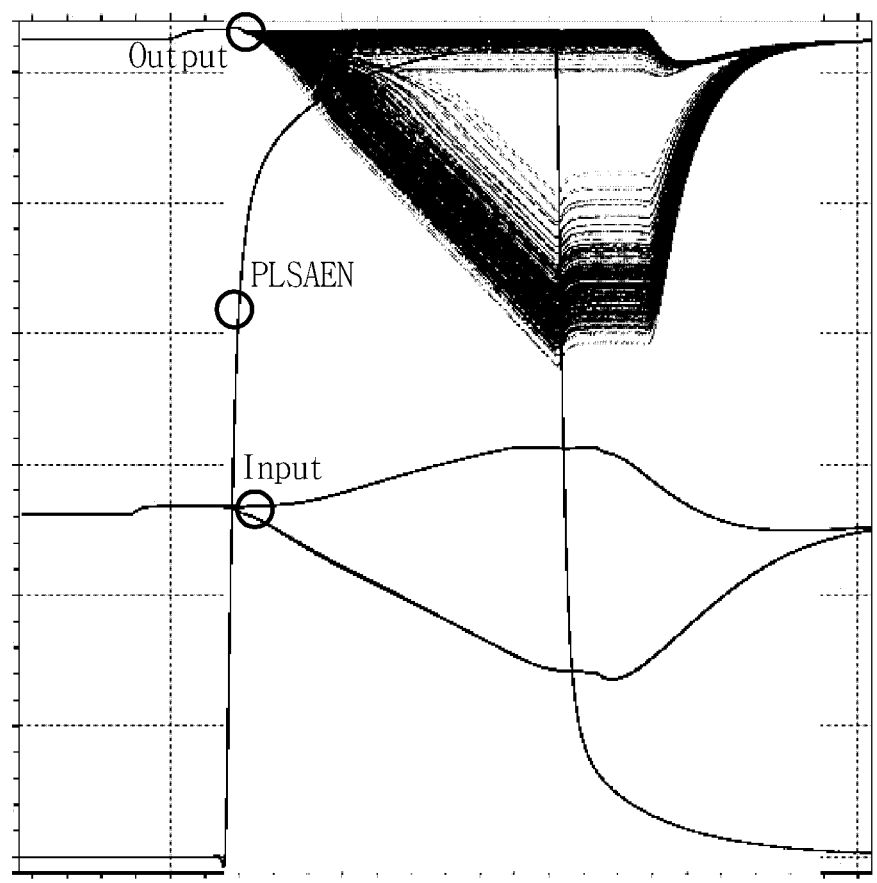
FIG. 10 is a Monte Carlo simulation diagram illustrating an operation of a CMOS latch-type sense amplifying circuit according to example embodiments.

FIG. 9 is a Monte Carlo simulation diagram illustrating an operation of a conventional latch-type sense amplifying circuit, and FIG. 10 is a Monte Carlo simulation diagram illustrating an operation of a CMOS latch-type sense amplifying circuit according to example embodiments. The waveforms of FIG. 9 and FIG. 10 illustrate results simulated by changing process parameters of each of the MOS transistors which comprises the CMOS latch-type sense amplifying circuit.

As shown in FIG. 9, in the conventional latch-type sense amplifying circuit, the waveform of an input voltage signal INPUT is changed according to a change of the process parameters due to an output voltage signal OUTPUT. On the contrary, as shown in FIG. 10, in the CMOS latch-type sense amplifying circuit according to example embodiments, the waveform of the input voltage signal INPUT is not much affected by the output voltage signal OUTPUT (e.g., the interference on the input voltage signal by the output voltage signal is greatly reduced, such that the input voltage signal includes less distortion than in a conventional latch-type sense amplifying circuit).

As shown in FIG. 7 through FIG. 10, the CMOS latch-type sense amplifying circuit according to example embodiments may decrease interference of signals between the input line pair and the output line pair by electrically separating the input line pair and the output line pair.

Figure 11:
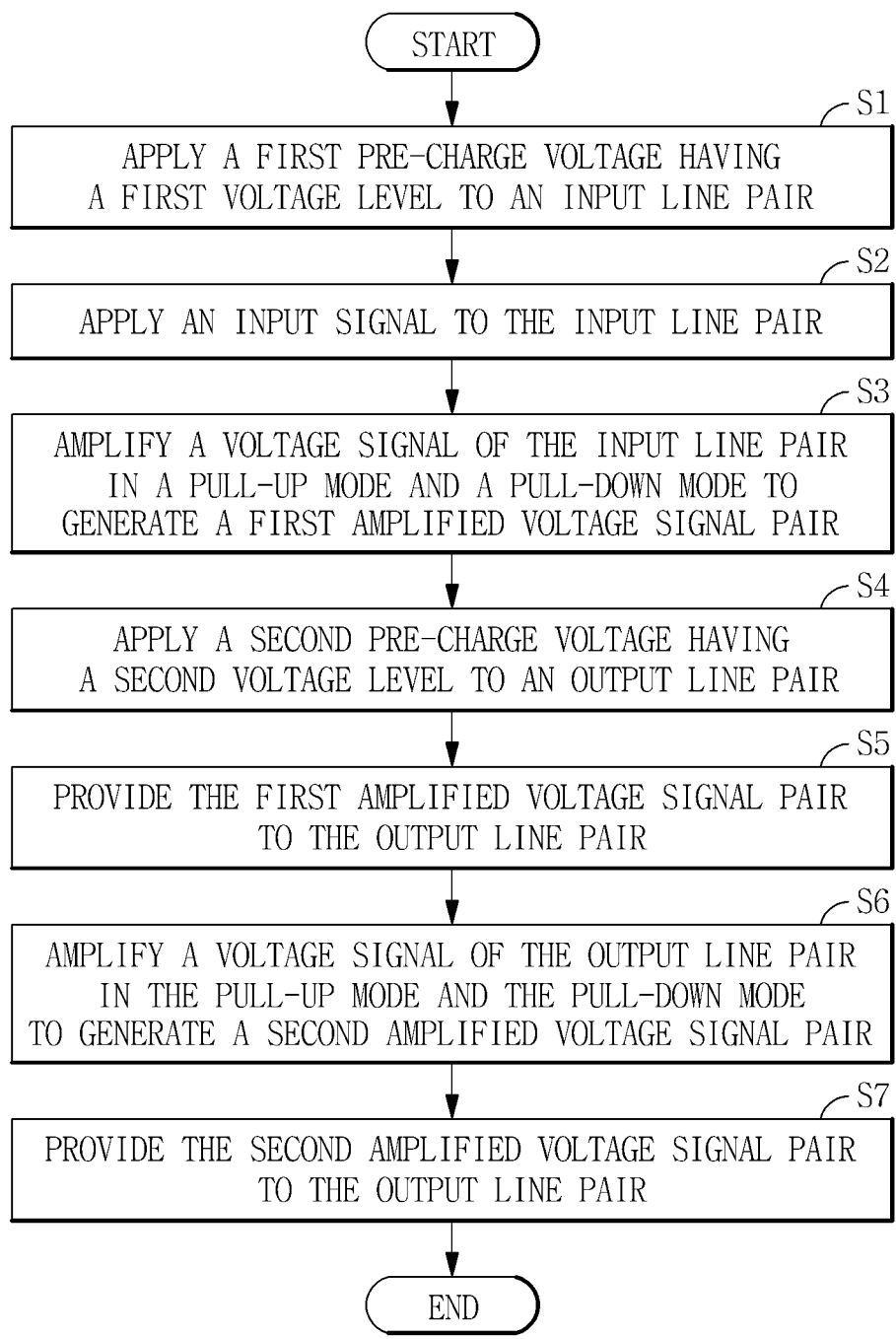
FIG. 11 is a flowchart illustrating a method of sensing a voltage signal according to an example embodiment.

FIG. 11 is a flowchart illustrating a method of sensing a voltage signal according to an example embodiment, wherein the interference and distortion of the voltage signals are reduced.

Referring to FIG. 11, the method of sensing a voltage signal includes the following steps.

1) apply a first pre-charge voltage having a first voltage level to an input line pair (S1);

2) apply an input signal to the input line pair (S2);

3) amplify a voltage signal of the input line pair in a pull-up mode and a pull-down mode to generate a first amplified voltage signal pair (S3);

4) apply a second pre-charge voltage having a second voltage level to an output line pair (S4);

5) provide the first amplified voltage signal pair to the output line pair (S5);

6) amplify a voltage signal of the output line pair in the pull-up mode and the pull-down mode to generate a second amplified voltage signal pair (S6);

7) provide the second amplified voltage signal pair to the output line pair (S7).

Although the above steps are described in a particular order, the steps described need not necessarily be performed in the order described. That is, certain of the steps may be performed in part or wholly simultaneously with other steps, and certain steps may occur in a different order than that described above.

As described above, a method of sensing a voltage signal may perform amplifying in a pull-up mode using PMOS transistors, and in a pull-down mode using NMOS transistors.

Figure 12:
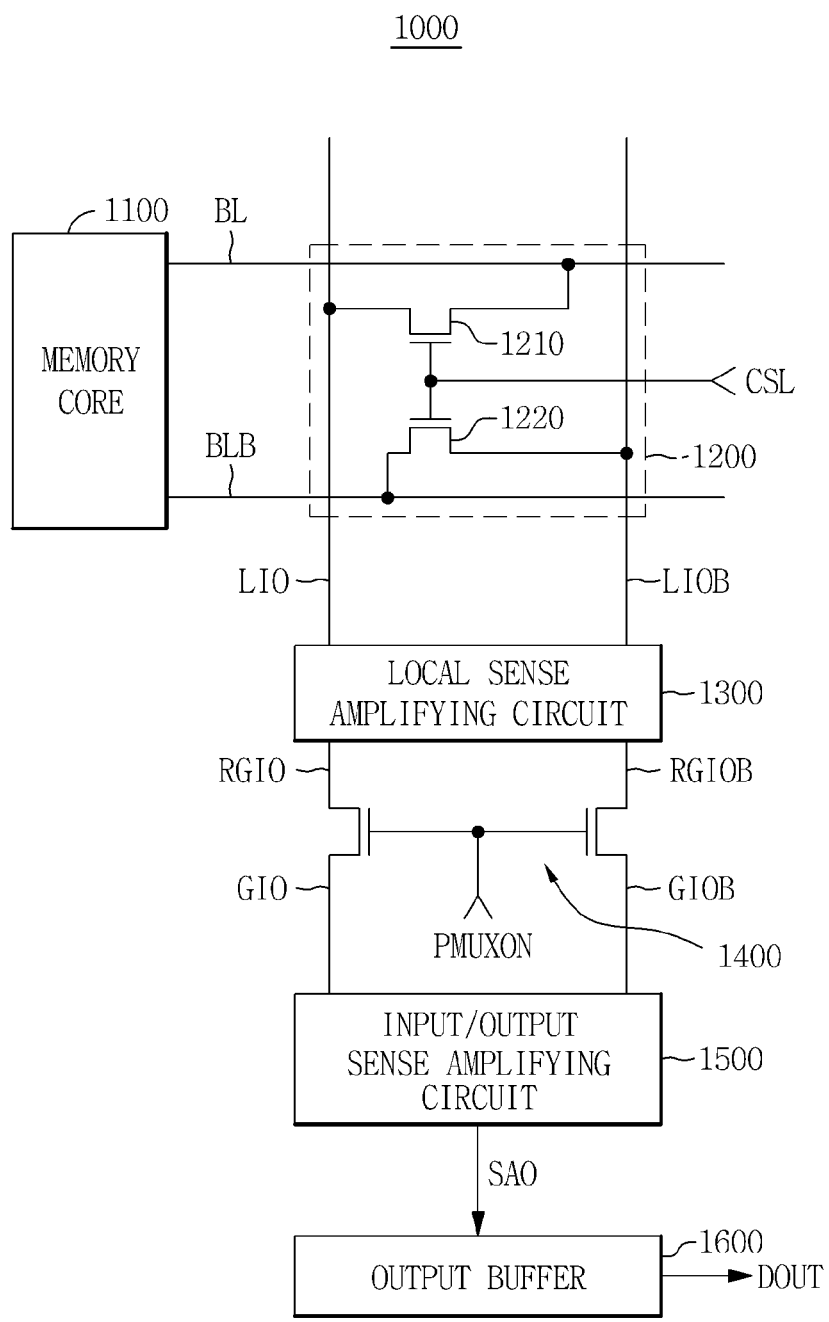
FIG. 12 is a circuit diagram illustrating a semiconductor memory device including a CMOS latch-type sense amplifying circuit according to example embodiments.

FIG. 12 is a circuit diagram illustrating a semiconductor memory device 1000 including a CMOS latch-type sense amplifying circuit according to example embodiments.

Referring to FIG. 12, the semiconductor memory device 1000 includes a memory core 1100 coupled to a bit-line pair BL and BLB, a column selecting circuit 1200, a local sense amplifying circuit 1300, a multiplexer 1400, an input/output sense amplifying circuit 1500 and an input/output buffer 1600.

The memory core 1100 may include a memory cell, a bit-line sense amplifying circuit and a pre-charge/equalizing circuit. The column selecting circuit 1200 outputs voltage signals of the bit-line pair BL and BLB to a local input/output line pair LIO and LIOB in response to a column selecting signal CSL. The column selecting circuit 1200 may include a first NMOS transistor 1210 which electrically couples a bit-line BL to a local input/output line LIO, and a second NMOS transistor 1220 which electrically couples a bit-line bar BLB to a local input/output line bar LIOB. The local sense amplifying circuit 1300 amplifies a signal of the local input/output line pair LIO and LIOB, and output the amplified signal to a global input/output line pair GIO and GIOB. The multiplexer 1400 receives a global selecting signal PMUXON, and in response, outputs voltage signals of the global input/output line pair GIO and GIOB. The input/output sense amplifying circuit 1500 amplifies a signal of the global input/output line pair GIO and GIOB and outputs an output SAO. In one embodiment, the output from the input/output sense amplifying circuit 1500 is a single output. The input/output buffer 1600 buffers an output signal SAO of the input/output sense amplifying circuit 1500 to generate an output data DOUT.

In FIG. 12, the local sense amplifying circuit 1300 may have a structure of a local sense amplifying circuit according to example embodiments as described above.

In the above, a CMOS latch-type sense amplifying circuit according to example embodiments is mainly described, but the example embodiments are not limited as such, and may be applied to other semiconductor integrated circuits that sense line voltages.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A CMOS latch-type sense amplifying circuit, comprising:

a CMOS differential amplifier including PMOS and NMOS transistors, the CMOS differential amplifier configured to amplify a voltage signal of an input line pair to generate a first amplified voltage signal pair, and provide the first amplified voltage signal pair to an output line pair, a first pre-charge voltage having a first voltage level being applied to the input line pair;

a CMOS latch-type sense amplifier configured to amplify a voltage signal of the output line pair to generate a second amplified voltage signal pair, and provide the second amplified voltage signal pair to the output line pair; and a first common node configured to connect to a high supply voltage or a low supply voltage based on a first common enable signal and connected to both the CMOS differential amplifier and the CMOS latch-type sense amplifier, such that the first common enable signal controls both the CMOS differential amplifier and the CMOS latch-type sense amplifier.

2. The CMOS latch-type sense amplifying circuit of claim 1, wherein the CMOS differential amplifier is configured to amplify the voltage signal of the input line pair in a pull-up mode using PMOS transistors, and amplify the voltage signal of the input line pair in a pull-down mode using NMOS transistors.

3. The CMOS latch-type sense amplifying circuit of claim 1, wherein the CMOS latch-type sense amplifier is configured to amplify the voltage signal of the output line pair in a pull-up mode using PMOS transistors, and amplify the voltage signal of the output line pair in a pull-down mode using NMOS transistors.

4. The CMOS latch-type sense amplifying circuit of claim 1, wherein the CMOS latch-type sense amplifier includes PMOS transistors and NMOS transistors cross-coupled to each other to form a latch.

5. The CMOS latch-type sense amplifying circuit of claim 1, wherein the CMOS differential amplifier includes:

a first PMOS transistor having a source connected to the first common node, a drain connected to a first output line, and a gate connected to a first input line;

a first NMOS transistor having a drain connected to the first output line, a source connected to a second common node controlled by a second common enable signal, and a gate connected to the first input line;

a second PMOS transistor having a source connected to the first common node, a drain connected to a second output line that composes the output line pair with the first output line, and a gate connected to a second input line that composes the input line pair with the first input line; and a second NMOS transistor having a drain connected to the second output line, a source connected to the second common node, and a gate connected to the second input line.

6. The CMOS latch-type sense amplifying circuit of claim 5, wherein the differential amplifier and the sense amplifier are configured to amplify the respective voltage signals of the input line pair and voltage signals of the output line pair simultaneously.

7. The CMOS latch-type sense amplifying circuit of claim 1, wherein the CMOS latch-type sense amplifier includes:
    a first PMOS transistor having a source connected to the first common node, a drain connected to a first output line, and a gate connected to a second output line that composes the output line pair with the first output line;
    a first NMOS transistor having a drain connected to the first output line, a source connected to a second common node controlled by a second common enable signal, and a gate connected to the second output line;
    a second PMOS transistor having a source connected to the first common node, a drain connected to the second output line, and a gate connected to the first output line; and
    a second NMOS transistor having a drain connected to the second output line, a source connected to the second common node, and a gate connected to the first output line.

8. The CMOS latch-type sense amplifying circuit of claim 7, wherein the CMOS differential amplifier includes:
    a third PMOS transistor having a source connected to the first common node, a drain connected to the first output line, and a gate connected to a first input line;
    a third NMOS transistor having a drain connected to the first output line, a source connected to the second common node, and a gate connected to the first input line;
    a fourth PMOS transistor having a source connected to the first common node, a drain connected to the second output line, and a gate connected to a second input line that composes the input line pair with the first input line; and
    a fourth NMOS transistor having a drain connected to the second output line, a source connected to the second common node, and a gate connected to the second input line,
    wherein the first common node is coupled to a high supply voltage, and the second common node is coupled to a low supply voltage.

9. The CMOS latch-type sense amplifying circuit of claim 1, wherein the CMOS latch-type sense amplifying circuit is configured to reduce interference on the voltage signal of the input line pair caused by the voltage signal of the output line pair.

10. A CMOS latch-type sense amplifying circuit, comprising:
    a first stage amplifier configured to amplify a voltage signal of an input line pair to generate a first amplified voltage signal pair, and provide the first amplified voltage signal pair to a first line pair, a first pre-charge voltage having a first voltage level being applied to the input line pair;
    a second stage sense amplifier configured to amplify a voltage signal of the first line pair to generate a second amplified voltage signal pair, and provide the second amplified voltage signal pair to the first line pair;
    a switch circuit coupled between the first line pair and an output line pair, configured to electrically couple the first line pair to the output line pair in response to a first switch control signal, a second pre-charge voltage having a second voltage level different from the first voltage level being applied to the output line pair; and
    a first common node controlled by a second switch control signal and connected to both the first stage amplifier and the second stage sense amplifier, such that the second switch control signal controls both the first stage amplifier and the second stage sense amplifier.

11. The CMOS latch-type sense amplifying circuit of claim 10, wherein the first line pair is cross-coupled to the output line pair through the switch circuit.

12. The CMOS latch-type sense amplifying circuit of claim 10, wherein the second voltage level is higher than the first voltage level.

13. The CMOS latch-type sense amplifying circuit of claim 10, wherein the input line pair is a local input/output line pair of a semiconductor memory device and the output line pair is a global input/output line pair of the semiconductor memory device.

14. The CMOS latch-type sense amplifying circuit of claim 13, wherein the second stage amplifier is a CMOS latch-type sense amplifier, which includes:
    a first PMOS transistor having a source connected to a high supply voltage, a gate to which the second switch control signal is applied, and a drain connected to the first common node;
    a second PMOS transistor having a source connected to the first common node, a drain connected to a first line, and a gate connected to a second line that composes the first line pair with the first line;
    a third PMOS transistor having a source connected to the first common node, a drain connected to the second line, and a gate connected to the first line;
    a first NMOS transistor having a drain connected to the first line, a source connected to a second common node, and a gate connected to the second line;
    a second NMOS transistor having a drain connected to the second line, a source connected to the second common node, and a gate connected to the first line; and
    a third NMOS transistor having a source connected to a low supply voltage, a gate to which a third switch control signal is applied, and a drain connected to the second common node, the third switch control signal being a complementary signal of the second switch control signal.

15. The CMOS latch-type sense amplifying circuit of claim 14, wherein the first stage amplifier comprises a CMOS differential amplifier, which includes:
    a fourth PMOS transistor having a source connected to the first common node, a drain connected to the first line, and a gate connected to a first input line of the input line pair;
    a fourth NMOS transistor having a drain connected to the first line, a source connected to the second common node, and a gate connected to the first input line;
    a fifth PMOS transistor having a source connected to the first common node, a drain connected to the second line, and a gate connected to a second input line that composes the input line pair with the first input line; and
    a fifth NMOS transistor having a drain connected to the second line, a source connected to the second common node, and a gate connected to the second local input/output line.

16. The CMOS latch-type sense amplifying circuit of claim 15, wherein the differential amplifier and the sense amplifier are configured to amplify the respective voltage signals of the input line pair and voltage signals of the first line pair simultaneously.

17. A semiconductor memory device, comprising:
a memory core coupled to a bit-line pair;
a column selecting circuit configured to output voltage signals of the bit-line pair to a local input/output line pair in response to a column selecting signal;
a CMOS differential amplifier including PMOS and NMOS transistors, the CMOS differential amplifier configured to receive a first set of voltage signals of the local input/output line pair, and output a second set of voltage signals to a first line pair;
a CMOS latch-type sense amplifier configured to amplify the second set of voltage signals of the first line pair, and output a third set of voltage signals to the first line pair;
a global selecting circuit configured to output voltage signals of the first line pair to a global input/output line pair in response to a global selecting signal;
an input/output sense amplifying circuit configured to amplify the voltage signals output from the global selecting circuit; and
an output buffer configured to receive voltage signals output from the input/output sense amplifying circuit and output an output voltage signal to an output line,
wherein the voltage signals of the local input/output line pair are electrically separated from the voltage signals output from the global input/output line pair, such that interference on the first set of input signals is reduced.

18. The semiconductor memory device of claim 17, further comprising:
a first pre-charge voltage, having a first voltage level, applied to the local input/output line pair; and
a second pre-charge voltage, having a second voltage level, applied to the global input/output line pair,
wherein the second voltage level is higher than the first voltage level.

19. The semiconductor memory device of claim 18, wherein the CMOS differential amplifier and the CMOS latch-type amplifier are connected to at least one common node configured to connect to a high supply voltage or a low supply voltage based on a signal and connected to both the CMOS differential amplifier and the CMOS latch-type amplifier.

20. The semiconductor memory device of claim 19, wherein the CMOS differential amplifier and the CMOS latch-type amplifier are configured to be enabled simultaneously.

* * * * *